United States Patent [19]

Hirano et al.

[11] Patent Number: 5,751,628

[45] Date of Patent: May 12, 1998

[54] FERROELECTRIC MEMORY DEVICES AND METHOD FOR TESTING THEM

[75] Inventors: Hiroshige Hirano, Nara; Nobuyuki Moriwaki; Tetsuji Nakakuma, both of Kyoto; Toshiyuki Honda; George Nakane, both of Nara, all of Japan

[73] Assignee: Matsushita Electronics Corporation, Osaka, Japan

[21] Appl. No.: 700,240

[22] Filed: Aug. 20, 1996

[30] Foreign Application Priority Data

Aug. 21, 1995 [JP] Japan ................................. 7-211943

[51] Int. Cl.⁶ ................................................ G11C 11/22
[52] U.S. Cl. ................................. 365/145; 365/201
[58] Field of Search ............................. 365/145, 149, 365/201, 210

[56] References Cited

U.S. PATENT DOCUMENTS 4,873,664 10/1989 Eaton, Jr. ................................. 365/145
5,297,077 3/1994 Imai et al. ................................. 365/145
5,392,234 2/1995 Hirano et al. ............................ 365/145
5,430,671 7/1995 Hirano et al. ............................ 365/145

Primary Examiner—Joseph A. Popek
Attorney, Agent, or Firm—Merchant, Gould, Smith, Edell, Welter & Schmidt, P.A.

[57] ABSTRACT

A memory cell comprises a ferroelectric capacitor, first main memory cells are connected to a first bit line, a first reference memory cell is connected to a second bit line, second main memory cells are connected to the second bit line, and a second reference memory cell is connected to the first bit line. When a first operation mode is selected by a control circuit comprising NAND gates and NOR gates, first main memory cells and first reference memory cell are selected, and when a second operation mode is selected, first main memory cells and second main memory cells are selected. Thus, by switching the operation between the two operation modes, a ferroelectric memory device that has stable operation at a low voltage and high integration at a high voltage is provided.

19 Claims, 9 Drawing Sheets

2

FERROELECTRIC MEMORY DEVICES AND METHOD FOR TESTING THEM

BACKGROUND OF THE INVENTION

This invention relates to ferroelectric memory devices and a method for testing them.

Recently, a ferroelectric memory device which implements nonvolatile stored data by using ferroelectric material for a memory cell capacitor has been devised. A ferroelectric capacitor has hysteresis properties, so that a remanent polarization of different polarity according to the electric field history remains even if the electric field is zero. Therefore, by representing stored data by the remanent polarization of the ferroelectric capacitor, a nonvolatile memory device can be implemented.

In U.S. Pat. No. 4,873,664, two types of ferroelectric memory devices are disclosed. In a first type, a memory cell comprises one transistor and one capacitor per one bit (1T1C), and one dummy memory cell (i.e., reference cell) is provided for, e.g., 256 main memory cells (i.e., normal cell).

In a second type, a memory comprises two transistors and two capacitors per one bit (2T2C), and a dummy memory cell is not provided. A pair of complementary data is stored in a pair of ferroelectric capacitors.

As the ferroelectric material that forms the capacitor, $KNO_3$, $PbLa_2O_3$—$ZrO_2$—$TiO_2$, and $PbTiO_3$—$PbZrO_3$, etc. are known. In the official gazette of the PCT International Publication No. WO 93/12542, a ferroelectric material suitable for a ferroelectric memory device having an extremely small stress compared with $PbTiO_3$—$PbZrO_3$ is disclosed.

According to the above-mentioned 1T1C type ferroelectric memory device, a reference memory cell capacitor (i.e., dummy memory cell capacitor) has, e.g., twice the capacitance (i.e., twice the area) of a main memory cell capacitor. Also, the size of the reference memory cell capacitor is different from that of the main memory cell capacitor. Thus, the size must be determined according to the performance of the ferroelectric capacitor.

In the conventional 1T1C type ferroelectric memory device, the size of a reference memory cell capacitor must be set differently from that of a main memory cell capacitor, however, the operational margin is reduced particularly at low voltage due to the performance variation and voltage dependency of the ferroelectric capacitor. In the 2T2C type ferroelectric memory device, operation is stable at low voltage, but the memory cell area for one bit is almost twice that of the 1T1C type.

In addition, in the conventional 2T2C type or 1T1C type device, a margin test for the performance of a ferroelectric capacitor cannot be done, so that a ferroelectric capacitor having low performance cannot be removed by screening.

The 1T1C type device has higher integration than the 2T2C type device, however, the 1T1C type device cannot be saved when it fails a test, and therefore, the yield declines. On the other hand, the 2T2C type device has low integration, so that the product cost is increased.

SUMMARY OF THE INVENTION

A ferroelectric memory device of the present invention comprises first and second bit lines, a first ferroelectric capacitor connected to the first bit line through a first memory cell transistor constituting a main memory cell, a second ferroelectric capacitor connected to the second bit line through a second memory cell transistor constituting the main memory cell, a third ferroelectric capacitor connected to the second bit line through a third memory cell transistor constituting a first reference memory cell, a fourth ferroelectric capacitor connected to the first bit line through a fourth memory cell transistor constituting a second reference memory cell, and a control circuit for controlling the gates of the first to fourth memory cell transistors.

The control circuit has the function to control first and second operation modes. In the first operation mode (i.e., 1T1C mode), the gate of each transistor of either of a group comprising the first and third memory cell transistors or a group comprising the second and fourth memory cell transistors is controlled. In the second operation mode (i.e., 2T2C mode), the gate of either one of the first and second memory cell transistors is controlled.

According to the above-mentioned structure, by switching the operation between the 1T1C mode and 2T2C mode, a ferroelectric memory device which has stable operation at a low voltage and high integration at a high voltage is provided. Preferably, the first memory cell transistor and the second memory cell transistor are located adjacent each other. Also, preferably, the ferroelectric memory device has a voltage sensing circuit, and the first operation mode and the second operation mode are switched by a sensing signal from the voltage sensing circuit.

According to one aspect of a method of testing the ferroelectric memory device of the present invention, the device is tested in the second operation mode, i.e., 2T2C mode, and then a device which passes the test in the 2T2C mode is tested in the first operation mode, i.e., 1T1C mode. In this method, a 1T1C type device can be tested in the 2T2C mode in a short time.

Also, according to another aspect of a testing method of the present invention, a margin test on a ferroelectric memory capacitor is done by writing in the 1T1C mode and reading in the 2T2C mode, using two different supply voltages (i.e., first and second supply voltages). In this method, only a highly reliable device can be provided by, for example, removing a ferroelectric capacitor having low performance by screening.

Furthermore, the 1T1C type and the 2T2C type can be switched, so that when a device fails a test as the 1T1C type, it can be commercialized as the 2T2C type. Therefore, improvement in yield can be expected.

DETAILED DESCRIPTION OF THE PREFERRED EMBODIMENTS

The embodiments of the present invention will be described below in detail by referring to the figures.

Figure 1:
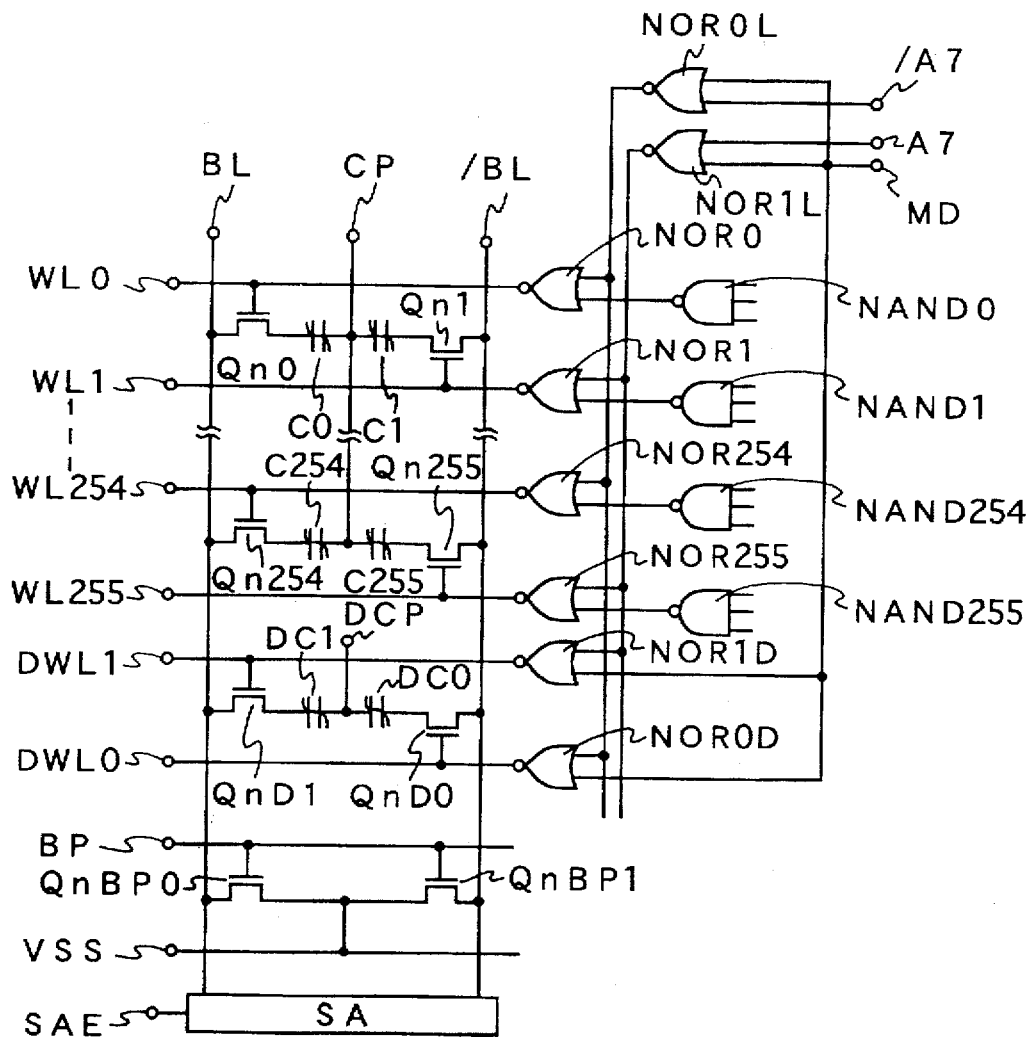
FIG. 1 is a circuit diagram of a ferroelectric memory device according to a first embodiment of the present invention.
Figure 2:
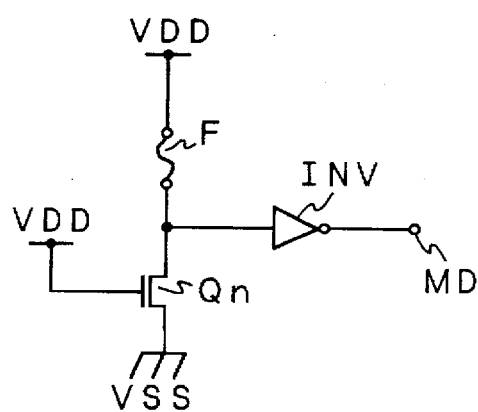
FIG. 2 is a circuit diagram of a control signal generating circuit of the ferroelectric memory device in FIG. 1.

FIG. 1 shows a circuit of a ferroelectric memory device according to a first embodiment of the present invention. FIG. 2. shows a circuit that generates a control signal MD. This ferroelectric memory cell can select either an operation mode in which one transistor and one ferroelectric capacitor constitute one bit data, or an operation mode in which two transistors and two ferroelectric capacitors constitute one bit data.

In FIG. 1, WL0-WL255 indicate word lines, DWL0 and DWL1 indicate reference word lines, BL and /BL indicate bit lines, CP indicates a cell plate electrode, DCP indicates a reference cell plate electrode, BP indicates a bit line precharge control signal, SAE indicates a sense amplifier control signal, VSS indicates a ground voltage, and SA indicates a sense amplifier. C0-C255 indicate main memory cell capacitors, DC0 and DC1 indicate reference memory cell capacitors, Qn0-Qn255, QnD0, QnD1, and QnBP0, QnBP1 indicate N channel type MOS transistors. Hereinafter, Qn0-Qn255 are referred to main memory cell transistors, and QnD0 and QnD1 are referred to reference memory cell transistors.

First, the structure of this ferroelectric memory device will be described. Bit lines BL and /BL are connected to sense amplifier SA. Sense amplifier SA is controlled by a sense amplifier control signal SAE. A first electrode of reference memory cell capacitor DC0 is connected to bit line /BL through reference memory cell transistor QnD0 whose gate electrode is connected to reference word line DWL0. A second electrode of reference memory cell capacitor DC0 is connected to reference cell plate electrode DCP.

A first electrode of reference memory cell capacitor DC1 is connected to bit line BL through reference memory cell transistor QnD1 whose gate electrode is connected to reference word line DWL1. A second electrode of reference memory cell capacitor DC1 is connected to reference cell plate electrode DCP.

A first electrode of main memory cell capacitor C0 is connected to bit line BL through main memory cell transistor Qn0 whose gate electrode is connected to word line WL0. A second electrode of main memory cell capacitor C0 is connected to cell plate electrode CP.

A first electrode of main memory cell capacitor C1 is connected to bit line /BL through main memory cell transistor Qn1 whose gate electrode is connected to word line WL1. A second electrode of main memory cell capacitor C1 is connected to cell plate electrode CP.

NOR gates NOR0-NOR255 are connected to word lines WL0-WL255, and NOR gates NOR0D and NOR1D are connected to reference word lines DWL0 and DWL1. NAND gates NAND0-NAND255 are connected to NOR0-NOR255 respectively. NOR0L is connected to even-numbered NOR gates NOR0, NOR2, etc., while NOR1L is connected to odd-numbered NOR gates NOR1, NOR3, etc. These gates constitute a control circuit for selecting an operation mode by control signal MD.

Also, a circuit that generates control signal MD for switching an operation mode comprises a fuse F, an N channel type MOS transistor Qn, and an inverter INV as shown in FIG. 2. Control signal MD is a logic voltage "L" when fuse F is not disconnected, and the signal becomes a logic voltage "H" when fuse F is disconnected.

When control signal MD is the logic voltage "L", word line WL0 and reference word line DWL0, for example, are selected to operate as the 1T1C mode. When control signal MD is the logic voltage "H", word lines WL0 and WL1, for example, are selected to operate in the 2T2C mode while reference word lines DWL0 and DWL1 are de-selected.

In the ferroelectric memory device of this embodiment, when stable operation is difficult in the 1T1C mode due to a decrease in the operating margin, stable operation can be obtained by switching to the 2T2C mode. In other words, a device which is not acceptable in the 1T1C mode can be useful when switched to 2T2C mode. Therefore, improvement in yield can be expected, and the product cost can be reduced.

Figure 3:
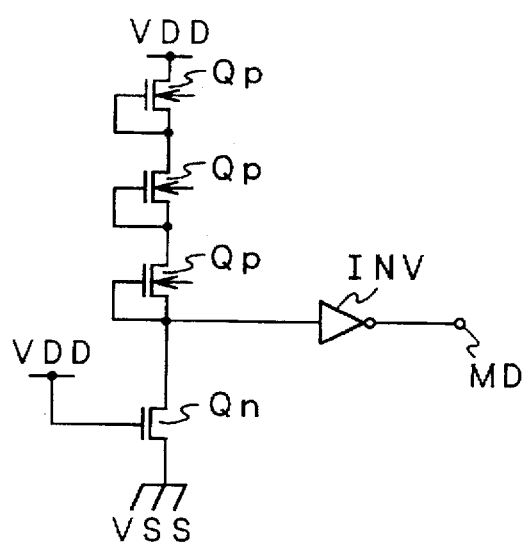
FIG. 3 is a circuit diagram of a control signal generating circuit of a ferroelectric memory device according to a second embodiment of the present invention.

Next, a ferroelectric memory device according to a second embodiment of the present invention will be described. In this device, the circuit that generates control signal MD for the ferroelectric memory device in the first embodiment is replaced by a circuit that uses a voltage sensing signal. In FIG. 3, an example of the structure of the voltage sensing circuit is shown. Control signal MD becomes the logic voltage "L" when a supply voltage VDD is high, and control signal MD becomes the logic voltage "H" when VDD is low.

In the 1T1C mode, the operating margin decreases particularly at a low voltage. The ferroelectric memory device of this embodiment performs high integration operation in the 1T1C mode when the supply voltage is high, and when the supply voltage becomes low, the mode is automatically switched to the 2T2C mode for stable operation. Also, by conducting a test (e.g. a pattern function test) in the 2T2C mode in a short time as well as conducting a margin test for the performance of a ferroelectric memory capacitor, a highly reliable device is provided.

Figure 4:
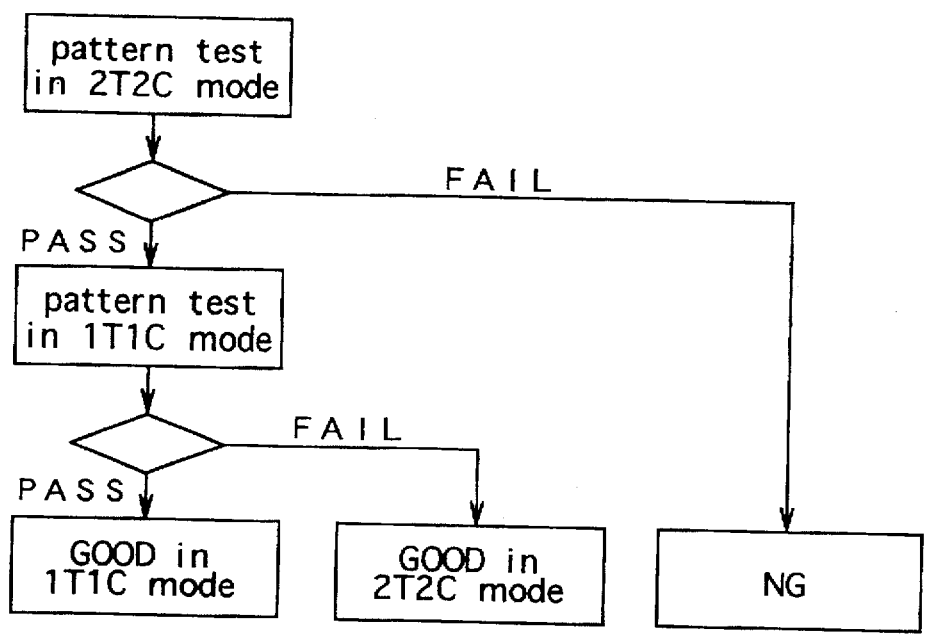
FIG. 4 is a flow chart of a method of testing a ferroelectric memory device according to a third embodiment of the present invention.
Figure 5:
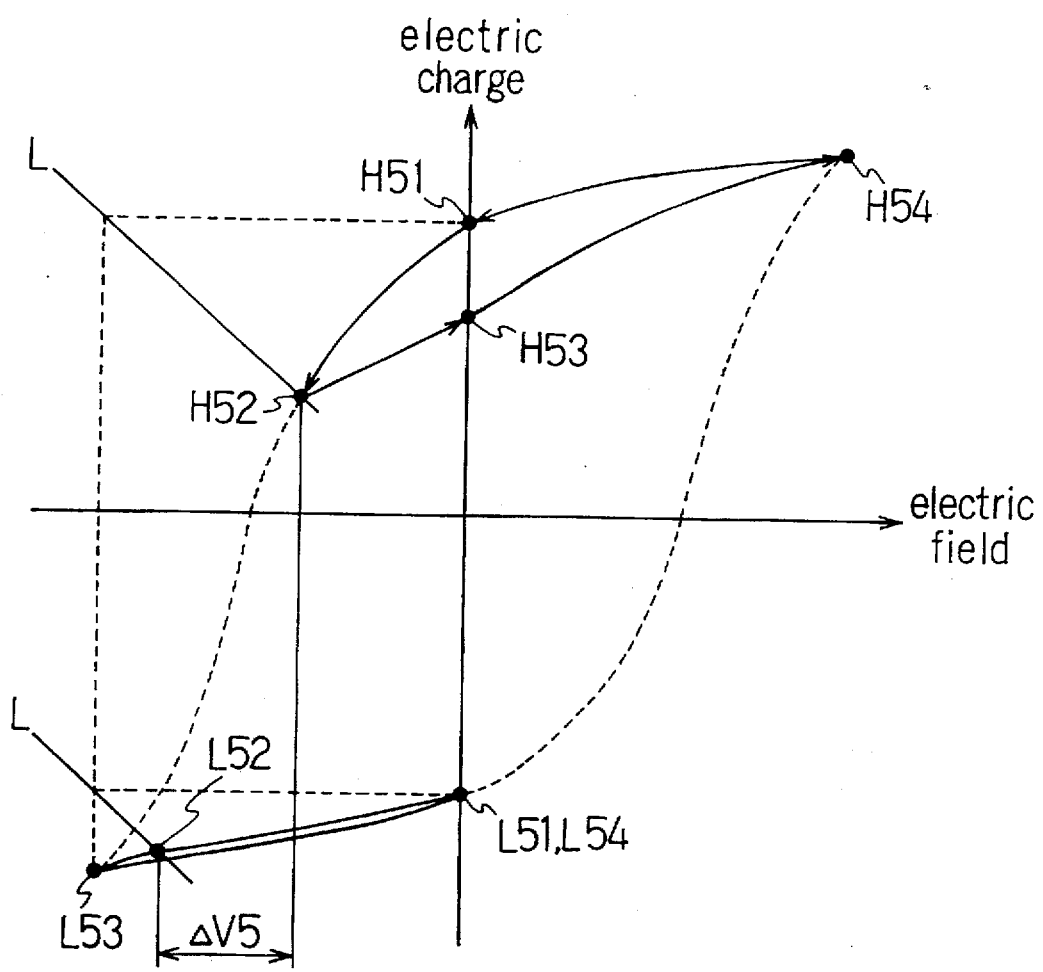
FIG. 5 is a view showing the hysteresis properties of a ferroelectric capacitor in the test method of FIG. 4.

Next, a method of testing a ferroelectric memory device according to a third embodiment of the present invention and a ferroelectric memory device with the test function will be described. In FIG. 4, a flow chart of this test method is shown. In FIG. 5, the hysteresis properties for the 2T2C mode operation of a ferroelectric capacitor in this test method is shown. As shown in FIG. 4, first, a first test is conducted in the 2T2C mode, and a device which fails the test is removed as a failed device. When a device passes the first test, a second test is subsequently conducted in the 1T1C mode, and a device which fails the second test is determined as a passed device in the 2T2C mode. A device which also passes the test in the 1T1C mode is determined as a passed device in the 1T1C mode.

Thus, by employing a test flow using the 2T2C mode, which requires a shorter test time than the 1T1C mode, a failed device can be removed earlier. Therefore, considering a wafer as a whole, the test time can be reduced.

FIG. 5 explains the hysteresis characteristics of the electric field applied to the ferroelectric capacitor of the memory cell while the vertical axis represents the electric charge at that time. In a ferroelectric material, residual polarization indicated with point H51 and point L51 remains even when the electric field is zero. Therefore, a nonvolatile semiconductor memory device is realized by utilizing the residual polarization remaining in the ferroelectric capacitor as nonvolatile data even if the power supply is interrupted.

Using the 2T2C mode, when the data in the memory cell is "1", the ferroelectric capacitor on one side of the memory cell is in the state of point H51 while the ferroelectric capacitor on the other side is in the state of point L51. When the data in the memory cell is "0", the ferroelectric capacitor on one side of the memory cell is in the state of point L51 while the ferroelectric capacitor on the other side is in the state of point H51. Line L has an inclination dependent on the value of the bit line capacitance.

When the data "1" is read out, the data is read out on bit line from capacitor and the condition of the ferroelectric capacitor on one side of the memory cell changes from the state of point H51 to the state of point H52. The condition of the ferroelectric capacitor on the other side of the memory cell changes from the state of point L51 to the state of the point L52. Thus, the potential difference $\Delta V5$ between the state of point H52 and the state of point L52 is generated. The potential of point H52 is amplified to that of point H53, and the potential of point L52 is amplified to that of point L53. Next, the potential of point H53 is restored to that of point H54, and the potential of point L53 is restored to that of point L54 which is equal to point L51. Next, the potential of point H54 is reset to that of point H51.

Also, in a test for the 1T1C mode, a writing operation in the 2T2C mode has already been performed, so that a test in which a writing operation is not performed and only a reading operation is performed can be conducted. In this case, the time required for a writing operation in the 1T1C mode is not necessary, so that the test time is further reduced. In FIG. 4, first, the determination of pass or fail is done by a test in the 2T2C mode. Alternatively, a test flow in which only a writing operation is performed in the 2T2C mode and only a reading operation is performed in the 1T1C mode may be employed. In this case, the test time is reduced to 75% compared with the case in which both writing and reading operations are performed in the 1T1C mode.

Furthermore, the ferroelectric memory device can be provided with a self-test function according to this test method. For example, first, the device conducts a self-test in the 2T2C mode, and when the device proves to be a passed device, the mode is switched to the 1T1C mode to conduct a test. It is also possible that, first, the device conducts a test in the 1T1C mode, and when the device proves to be a failed device, the mode is switched to the 2T2C mode to conduct a test, and a device which passes the test is determined as a passed device in the 2T2C mode.

Next, a method of testing a ferroelectric memory device according to a fourth embodiment of the present invention will be described. A flow chart of this test method is shown in FIG. 6, and the hysteresis properties of the operation of a ferroelectric capacitor are shown in FIG. 7.

Figure 6:
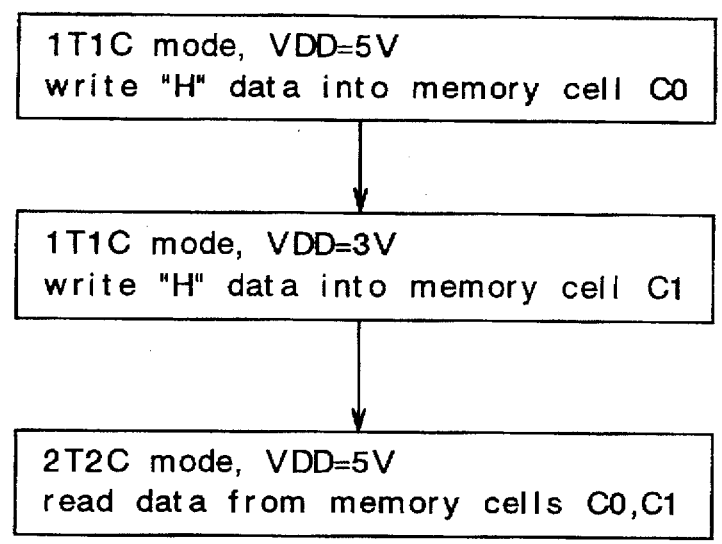
FIG. 6 is a flow chart of a method of testing a ferroelectric memory device according to a fourth embodiment of the present invention.
Figure 7:
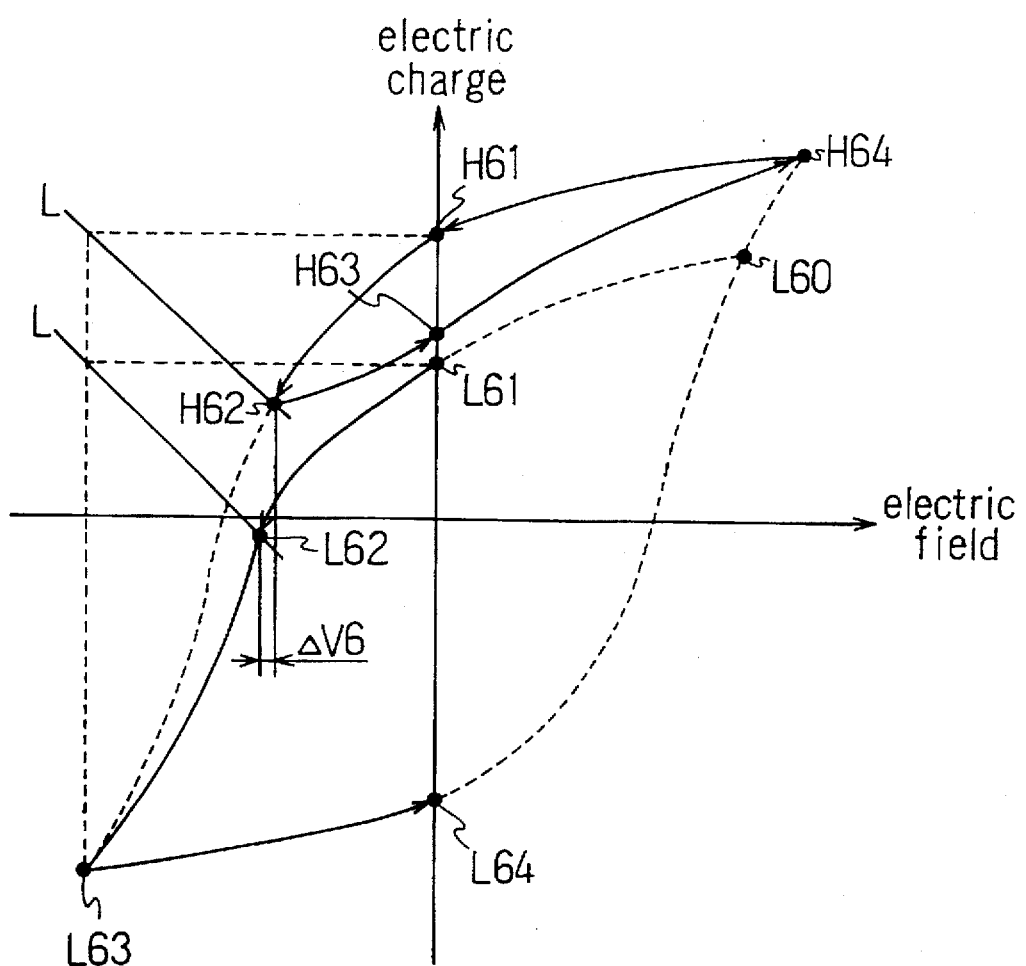
FIG. 7 is a view showing the hysteresis properties of a ferroelectric capacitor in the test method of FIG. 6.

As shown in FIG. 6, first, H data is written into memory cell C0 in FIG. 1 at a supply voltage VDD=5 V in the 1T1C mode. Thus, the state of point H64 changes to the state of point H61 in the hysteresis curve shown in FIG. 7. Then, H data is written into memory cell C1 at a supply voltage VDD=3 V in the 1T1C mode. Thus, the state of point L60 changes to the state of point L61 in the hysteresis curve shown in FIG. 7. Then a reading operation is performed in the 2T2C mode. Since H data is written at different supply voltages, H61 and L61 are initial states, which are the same direction for polarization. When the reading operation is performed in the 2T2C mode from this state, a potential difference in reading $\Delta V6$ in FIG. 7 is obtained. This is smaller than the potential difference in reading $\Delta V5$ in the third embodiment. For example, a ferroelectric capacitor having low performance can be removed by screening to provide only a highly reliable device.

Also, the test method in this embodiment can be applied to the case in which the ferroelectric memory device has a self-test function, in addition to the case in which a ferroelectric capacitor having low performance is screened out using external test equipment. For example, the ferroelectric memory device may be provided with function in which, when a mode is switched to a screening mode, a voltage-dropping circuit is automatically activated to lower an internal supply voltage, or the voltage of the cell plate of a memory cell is lowered below the supply voltage for conducting a test.

Figure 8:
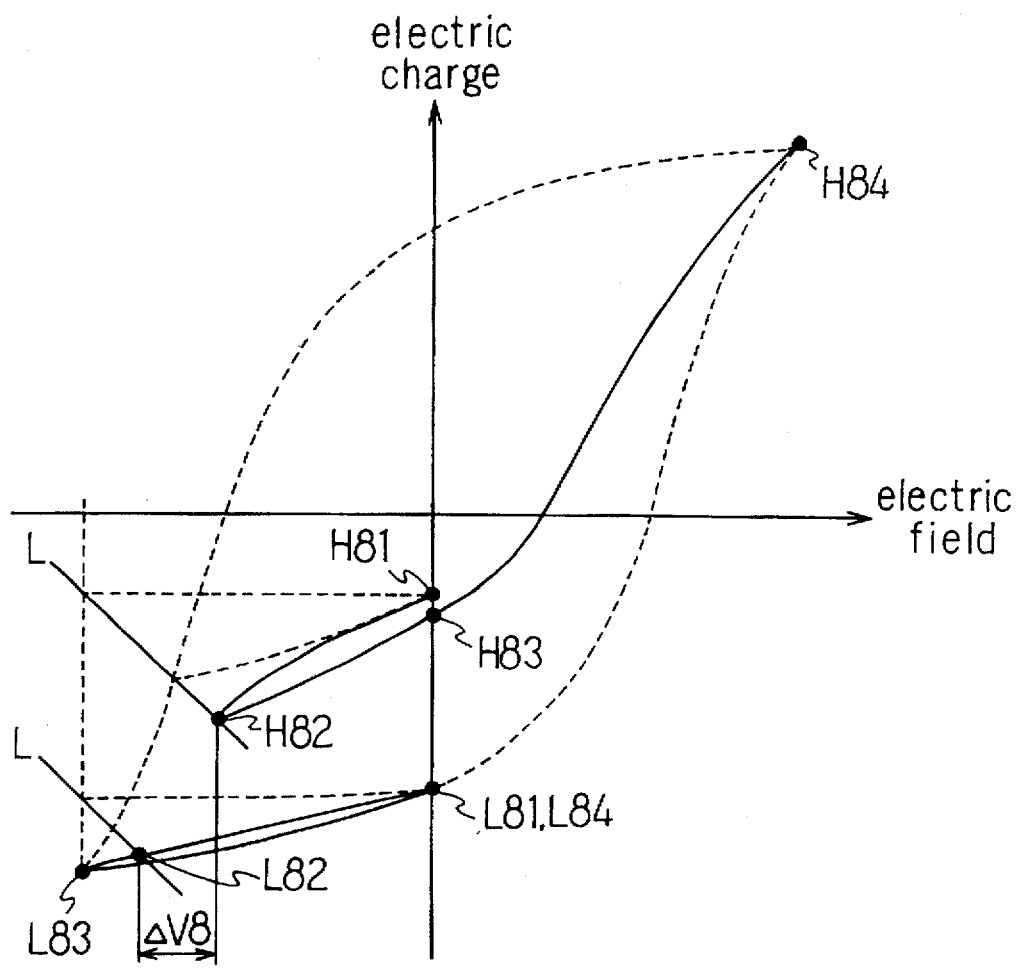
FIG. 8 is a view showing the hysteresis properties of a ferroelectric capacitor in a method of testing a ferroelectric memory device according to a fifth embodiment of the present invention.

Next, a method of testing a ferroelectric memory device according to a fifth embodiment of the present invention will be described. While H data are written in the 1T1C mode at different voltages in the above-mentioned fourth embodiment, L data are written in this embodiment. The hysteresis properties of a ferroelectric capacitor in the test method of this embodiment is shown in FIG. 8. H81 and L81 are initial states, which are the same direction for polarization.

In this embodiment, potential difference in reading $\Delta V8$ different from that in the fourth embodiment is obtained, and a test can be conducted with a test margin suitable for the device in question. Also, the ferroelectric memory device can be provided with a self-test function according the test method in this embodiment. In addition, by combining this test method with the test method in the fourth embodiment, screening of a ferroelectric capacitor can be performed under plural conditions.

Figure 9:
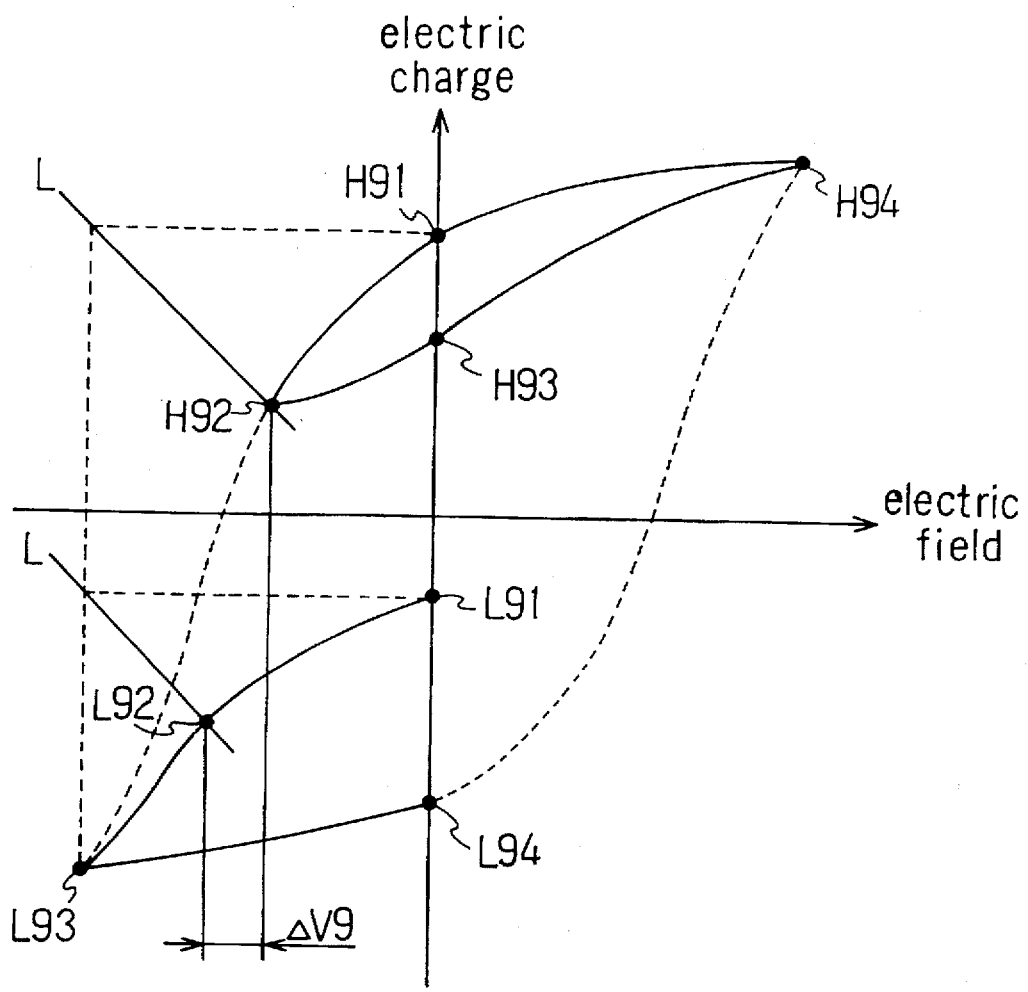
FIG. 9 is a view showing the hysteresis properties of a ferroelectric capacitor in a method of testing a ferroelectric memory device according to a sixth embodiment of the present invention.

Next, a method of testing a ferroelectric memory device according to a sixth embodiment of the present invention will be described. While only H data or L data are written in the 1T1C mode at different voltages in the fourth and fifth embodiments, H data and L data are respectively written at different voltages in this embodiment. The hysteresis properties of a ferroelectric capacitor in the testing method of this embodiment are shown in FIG. 9.

In this embodiment, different from the fourth or fifth embodiment, a test can be conducted by a reading method similar to the normal operation in 2T2C with the margin of potential difference in reading. H91 and L91 are initial states, which are the different direction for polarization. The potential difference in reading in this case is $\Delta V9$ in FIG. 9. Also, the ferroelectric memory device can be provided with a self-test function according to the test method in this embodiment.

As mentioned above, according to the present invention, by switching the operation of the 1T1C type and the 2T2C type, a ferroelectric memory device which has stable operation at a low voltage and high integration at a high voltage can be provided. Also, by conducting a test in a short time and a margin test on a ferroelectric memory capacitor, a highly reliable device can be provided.

We claim:

1. A ferroelectric memory device comprising:

first and second bit lines;

a first ferroelectric capacitor connected to said first bit line through a first memory cell transistor, said first capacitor constituting a main memory cell;

a second ferroelectric capacitor connected to said second bit line through a second memory cell transistor, said second capacitor constituting the main memory cell;

a third ferroelectric capacitor connected to said second bit line through a third memory cell transistor, said third capacitor constituting a first reference memory cell;

a fourth ferroelectric capacitor connected to said first bit line through a fourth memory cell transistor, said fourth capacitor constituting a second reference memory cell;

a first word line connected to a gate of said first memory cell transistor;

a second word line connected to a gate of said second memory cell transistor;

a third word line connected to a gate of said third memory cell transistor;

a fourth word line connected to a gate of said fourth memory cell transistor; and a control circuit for controlling said first to fourth word lines, said control circuit functioning to control first and second operation modes, by controlling either said first or second word line in said first operation mode, and controlling both said first and second word lines in said second operation mode.

2. The ferroelectric memory device according to claim 1, wherein said first and second memory cells are located adjacent each other.

3. The ferroelectric memory device according to claim 1, further comprising a voltage sensing circuit, wherein the first and second operation modes are controlled by an output signal from said voltage sensing circuit.

4. The ferroelectric memory device according to claim 1, wherein the ferroelectric memory device tests itself in said second operation mode, and then tests itself in said first operation mode.

5. The ferroelectric memory device according to claim 4, wherein the ferroelectric memory device performs a writing operation in said second operation mode, and then, performs a reading operation in said first operation mode.

6. The ferroelectric memory device according to claim 1, wherein the ferroelectric memory device tests itself in said second operation mode, and then, tests itself in said first operation mode if the test in said second operation mode is passed.

7. The ferroelectric memory device according to claim 1, wherein the ferroelectric memory device writes data into the first ferroelectric capacitor in said first operation mode using a first supply voltage, and writes data into the second ferroelectric capacitor in said first operation mode using a second supply voltage, and then reads data in said second operation mode.

8. The ferroelectric memory device according to claim 1, wherein the ferroelectric memory device writes H data into the first ferroelectric capacitor in said first operation mode using a first supply voltage, and writes H data into the second ferroelectric capacitor in said first operation mode using a second supply voltage, and then reads data in said second operation mode.

9. The ferroelectric memory device according to claim 1, wherein the ferroelectric memory device writes L data into the first ferroelectric capacitor in said first operation mode using a first supply voltage, and writes L data into the second ferroelectric capacitor in said first operation mode using a second supply voltage, and then reads data in said second operation mode.

10. The ferroelectric memory device according to claim 1, wherein the ferroelectric memory device writes H data into the first ferroelectric capacitor in said first operation mode using a first supply voltage, and writes L data into the second ferroelectric capacitor in said first operation mode using a second supply voltage, and then reads data in said second operation mode.

11. A method for testing a ferroelectric memory device that comprises first and second bit lines, a first ferroelectric capacitor forming a main memory cell and connected to said first bit line through a first memory cell transistor, a second ferroelectric capacitor forming the main memory cell and connected to said second bit line through a second memory cell transistor, a first word line connected to a gate of said first memory cell transistor, a second word line connected to a gate of said second memory cell transistor, and a control circuit for controlling either said first or second word line in a first operation mode and controlling both said first and second word lines in a second operation mode, the method comprising the steps of testing the device in said first operation mode, and testing the device in said second operation mode.

12. The method according to claim 11, wherein the step of testing in said second operation mode is performed before the step of testing in said first operation mode.

13. The method according to claim 12, wherein the step of testing in said second operation mode includes writing operation, and the step of testing of testing in said first operation mode includes reading operation.

14. The method according to claim 12, wherein the step of testing in said first operation mode is performed only when the test in said second operation mode has been passed.

15. The method according to claim 11, wherein the step of testing in said first operation mode is performed before the step of testing in said second operation mode.

16. The method according to claim 15, wherein the step of testing in said first operation mode includes writing data into the first ferroelectric capacitor using a first supply voltage and writing data into the second ferroelectric capacitor using a second supply voltage, and the step of testing in said second operation mode includes reading operation.

17. The method according to claim 16, wherein the step of testing in said first operation mode includes writing H data into the first ferroelectric capacitor using a first supply voltage and writing H data into the second ferroelectric capacitor using a second supply voltage.

18. The method according to claim 16, wherein the step of testing in said first operation mode includes writing L data into the first ferroelectric capacitor using a first supply voltage and writing L data into the second ferroelectric capacitor using a second supply voltage.

19. The method according to claim 16, wherein the step of testing in said first operation mode includes writing H data into the first ferroelectric capacitor using a first supply voltage and writing L data into the second ferroelectric capacitor using a second supply voltage.

* * * * *